United States Patent
Tsai et al.

(10) Patent No.: US 8,435,837 B2
(45) Date of Patent: May 7, 2013

(54) PANEL BASED LEAD FRAME PACKAGING METHOD AND DEVICE

(75) Inventors: Chen Lung Tsai, Saratoga, CA (US); Long-Ching Wang, Cupertino, CA (US); Tze-Pin Lin, El Sobrante, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 402 days.

(21) Appl. No.: 12/638,827

(22) Filed: Dec. 15, 2009

(65) Prior Publication Data

US 2011/0140254 A1    Jun. 16, 2011

(51) Int. Cl.
*H01L 21/00* (2006.01)

(52) U.S. Cl.
USPC ............................ 438/112; 438/119; 438/123

(58) Field of Classification Search .................. 438/123, 438/113, 119
See application file for complete search history.

(56) References Cited

U.S. PATENT DOCUMENTS

| | | | |
|---|---|---|---|
| 4,796,078 A | 1/1989 | Phelps et al. | |
| 6,380,620 B1 | 4/2002 | Suminoe et al. | |
| 6,841,854 B2 * | 1/2005 | Itou et al. | 257/666 |
| 6,909,054 B2 * | 6/2005 | Sakamoto et al. | 174/260 |
| 7,122,401 B2 * | 10/2006 | Song | 438/108 |
| 7,224,061 B2 | 5/2007 | Yang et al. | |
| 7,514,767 B2 | 4/2009 | Yang | |
| 7,521,283 B2 * | 4/2009 | Machida et al. | 438/106 |
| 7,557,437 B2 | 7/2009 | Yang et al. | |
| 7,589,404 B2 * | 9/2009 | Itou et al. | 257/676 |
| 7,679,172 B2 * | 3/2010 | Huang et al. | 257/678 |
| 7,727,802 B2 * | 6/2010 | Sunohara et al. | 438/107 |
| 7,939,933 B2 * | 5/2011 | Itou et al. | 257/696 |
| 8,084,299 B2 * | 12/2011 | Tan et al. | 438/111 |
| 2002/0109237 A1 | 8/2002 | Oka | |
| 2005/0067721 A1 * | 3/2005 | Blaszczak et al. | 257/787 |
| 2006/0003495 A1 * | 1/2006 | Sunohara et al. | 438/124 |
| 2006/0021791 A1 * | 2/2006 | Sunohara et al. | 174/255 |
| 2006/0055040 A1 | 3/2006 | Brooks et al. | |
| 2007/0018291 A1 * | 1/2007 | Huang et al. | 257/676 |
| 2007/0108610 A1 * | 5/2007 | Kondo | 257/737 |
| 2007/0139899 A1 * | 6/2007 | Van Schuylenbergh et al. | 361/760 |
| 2007/0152308 A1 | 7/2007 | Ha et al. | |

(Continued)

OTHER PUBLICATIONS

PCT Search Report dated Jan. 25, 2011 corresponding to the related PCT Patent Application No. US10/57026.

*Primary Examiner* — David Vu
*Assistant Examiner* — Earl Taylor
(74) *Attorney, Agent, or Firm* — DLA Piper LLP (US)

(57) ABSTRACT

A packaged semiconductor die has a preformed lead frame with a central recessed portion, and a plurality of conductive leads. An integrated circuit die has a top surface and a bottom surface opposite thereto, with the top surface having a plurality of bonding pads for electrical connection to the die. The die is positioned in the central recessed portion with the top surface having the bonding pads facing upward, and the bottom surface in contact with the recessed portion. Each of the leads has a top portion and a bottom portion. The leads are spaced apart and insulated from the central recessed portion. A conductive layer is deposited on the top surface of the die and the top portion of the leads and is patterned to electrically connect certain of the bonding pads of the die to certain of the conductive leads. An insulator covers the conductive layer. The present invention also relates to a method of packaging such an integrated circuit die.

7 Claims, 8 Drawing Sheets

U.S. PATENT DOCUMENTS

| | | |
|---|---|---|
| 2008/0251898 A1* | 10/2008 | Itou et al. ............ 257/666 |
| 2008/0258278 A1 | 10/2008 | Ramos et al. |
| 2009/0194854 A1* | 8/2009 | Tan et al. ............. 257/666 |
| 2009/0230523 A1* | 9/2009 | Chien et al. .......... 257/676 |
| 2009/0230524 A1* | 9/2009 | Chien et al. .......... 257/676 |
| 2009/0230525 A1* | 9/2009 | Chang Chien et al. ....... 257/676 |
| 2009/0230526 A1 | 9/2009 | Chen et al. |
| 2009/0294950 A1* | 12/2009 | Itou et al. ............. 257/690 |
| 2011/0062584 A1* | 3/2011 | Ishihara ............... 257/737 |
| 2011/0140254 A1* | 6/2011 | Tsai et al. ............ 257/676 |

* cited by examiner

PANEL BASED LEAD FRAME PACKAGING METHOD AND DEVICE

TECHNICAL FIELD

The present invention relates to a method for packaging semiconductor dies on a panel using a lead frame. The present invention also relates to a device made by such method and in particular wherein the device is capable of package-on-package stacking.

BACKGROUND OF THE INVENTION

Packaging of semiconductor dies using a lead frame is well known in the art. Referring to FIG. 1, there is shown a cross-sectional view of a packaged semiconductor die using a lead frame. A plan view of a lead frame 20 of the prior art is shown in FIG. 20. The packaged die 10 comprises a lead frame 20 having a central recessed portion 14 and a plurality of spaced apart leads 12. An integrated circuit die 22 has a top surface 24 and a bottom surface 26, with the top surface 24 having a plurality of bonding pads which electrically connect to the various circuit elements in the integrated circuit die 24. The die 22 is positioned in the recessed portion 14, such that the bottom surface 26 of the die 22 rests on the recessed portion 14, through a conductive paste and is electrically connected to the recessed portion 14. The recessed portion 14 is formed of a conductive material. A plurality of bonding wires 30 connect certain of the bonding pads on the top surface of the die 22 to the top side of certain of the leads 12. Each of the leads 12 has a bottom side 32, opposite to the top side, which are will be connected to various electrical pads on a printed circuit board (PCB) for system application. The recessed portion 14 is also connected to an electrical contact, typically ground, on the printed circuit board on the same side as the bottom side 32 of the leads 12.

In the method of the prior art, the die 22 is first placed on the recessed portion 14 of a preformed lead frame 20. The die 22 may be attached to the recessed portion 14 by adhesive to prevent movement of the die 22 in the subsequent steps. A wire bonding machine bonds certain of the bonding pads of the die 22 to the top side of certain of the leads 12. Once all the wires have been so bonded, resin is injected into a mold chest to encapsulate and insulate the die 22, the wires 30 and the top sides of the leads 12. The structure is then singulated or cut and each packaged die can then be used to connect to other packaged semiconductor devices, by well known techniques, such as by soldering the packaged die 10 on a printed circuit board PCB. In that event, the bottom sides 32 of the leads 12 and the bottom surface of the recessed portion 14, can be soldered to the PCB. Thus, the packaged semiconductor die of the prior art, as shown in FIG. 1 has electrical connections to only one side of the packaged die for connection to a printed circuit board.

Referring to FIG. 2a, there is shown the first step in another method of forming a packaged semiconductor die 40 of another prior art, which is very similar to the method shown and described in FIG. 1. In this method, the method begins with a slab of copper alloy 42, having a top side and a bottom side. Photoresist 44 is applied to both the top side and the bottom side, and a masking step is formed on both sides. After the unmasked portions of the photoresist 44 are removed, a solderable material 46, such as tin is sputtered to fill the removed portions. The resultant structure is shown in FIG. 2b.

The photoresist 44 is then removed, leaving the solderable material 46 on the copper alloy 42. The resultant structure is shown in FIG. 2c. With the solderable material 46 as a mask, a wet etch of the copper is performed on the top side of the copper alloy 42. The etch forms a recessed central portion 50. The resultant structure is shown in FIG. 2d.

A die 22 is placed in the recessed cavity 50 with the bonding pads of the die 22 facing outwardly. Wires are then bonded to the bonding pads of the die 22 and to the solderable posts 46 on the top side. An insulator encapsulation material is then applied to the top side of the die 22 and the etched copper alloy at the bottom side. The resultant structure is then singulated or cut and the result is shown in FIG. 2f.

One of the differences between the method shown in FIG. 1 and the method shown in FIGS. 2(a-f) is that in the method of FIG. 1, a preformed lead frame 20 is used. In contrast, in the method shown in FIGS. 2(a-f) a slab of copper alloy is etched to form a lead frame. In both methods, however, wire bonding electrically connects the bonding pads of the die 22 to the top sides of the posts of the lead frame. As a result, the resultant packaged structure is incapable of being electrically connected together in a POP (Packaged-on-Package) configuration, or where on packaged die is electrically connected in a stacked manner to another packaged die.

Finally, panel based packaging of dies with patterned conductors by sputtering or plating serving as electrical connections to bonding pads of semiconductors dies are also well known in the art. See for example U.S. Pat. Nos. 7,224,061; 7,514,767; and 7,557,437.

SUMMARY OF THE INVENTION

Accordingly, in the present invention, a method of packaging an integrated circuit die comprises placing a plurality of integrated circuit dies on a first substrate having a planar surface, with each of the plurality of dies having a top surface and a bottom surface. The top surface has a plurality of bonding pads for electrical connection to the die. The plurality of dies are positioned with the top surface in contact with the planar surface of the first substrate. A conductive adhesive is applied to the bottom surface of each of the dies. A plurality of preformed lead frames are placed on the plurality of dies with each lead frame having a central recessed portion, and a plurality of conductive leads. Each lead has a top side and a bottom side, with the central recessed portion connected to the plurality of leads by a connection for electrical conductivity. The central recessed portion has a top portion and a bottom portion with the bottom portion substantially co-planar with the bottom side of the plurality of leads. The central recessed portion of the lead frame is placed on the conductive adhesive back side of the plurality of dies with the top portion of the recessed portion in contact with the conductive adhesive until the top side of each lead is in contact with the planar surface of the first substrate. The first substrate is then removed. The plurality of lead frames are placed with the plurality of dies on a second substrate having a planar surface, with the bottom side of each lead and the bottom portion of the recessed portion on the planar surface of the second substrate. A conductive layer is deposited on the top surface of the die and the top side of the leads and is patterned to form electrical connection between certain of the bonding pads of one of the plurality of dies to certain of the conductive leads associated with the one die. The connection of each lead frame is cut from its adjacent lead frames and the leads from said recessed portion. The bottom sides of the leads and central recessed portion are exposed to form package terminals.

A packaged die made by the foregoing described method is also disclosed.

DETAILED DESCRIPTION OF THE INVENTION

Figure 1:
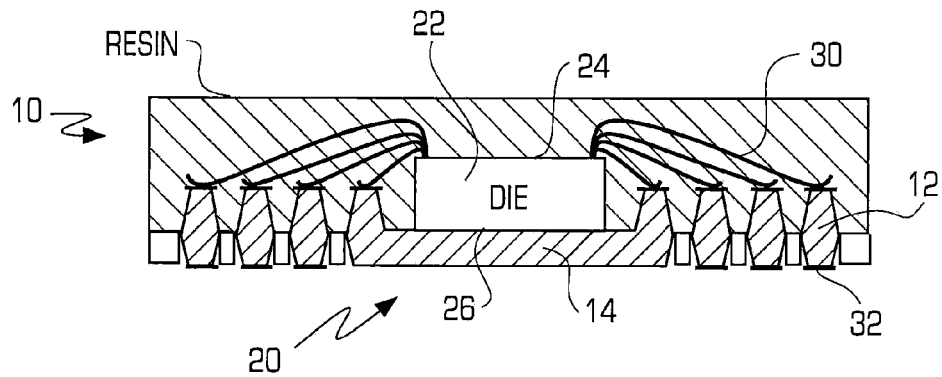
FIG. 1 is a cross-sectional view of a packaged die with a lead frame packaged with the method of the prior art FIG. 2(a-f) are cross-sectional views of another method of the prior art.
Figure 2A:
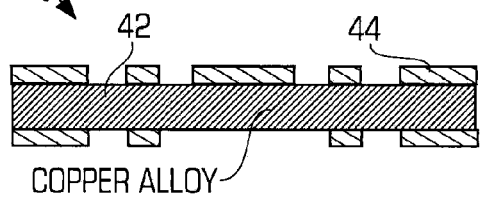
Figure 2D:
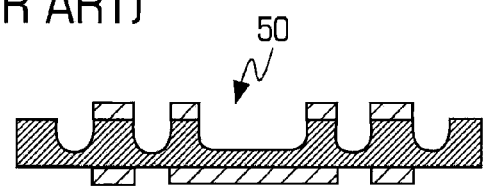
Figure 2B:
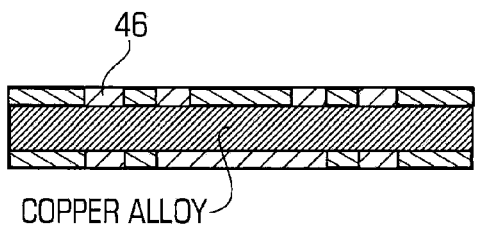
Figure 2E:
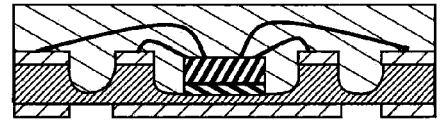
Figure 2C:
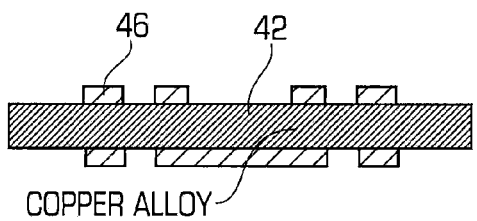
Figure 2F:
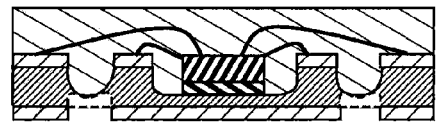
Figure 3:
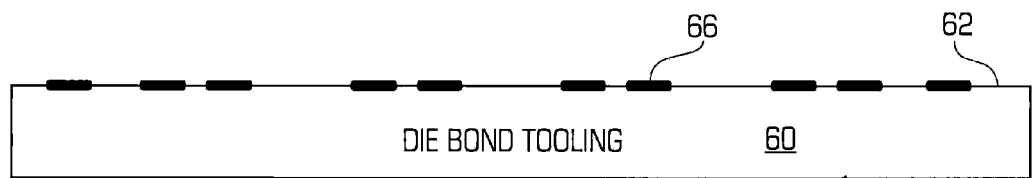
FIG. 3 is a cross-sectional view of the first step in the method of the present invention.

Referring to FIG. 3 there is shown a cross-sectional view of a first step in the method of the present invention. The method begins with a first substrate 60. The first substrate 60 can be glass or any material that has rigid characteristics. The first substrate 60 has a top surface 62 and a bottom surface 64, opposite thereto. The top surface 62 is marked with a plurality of marks 66. The marks 66 correspond to locations where an integrated circuit die 70 whose bonding pads 72 will be placed. The resultant structure is shown in FIG. 3.

Figure 4:
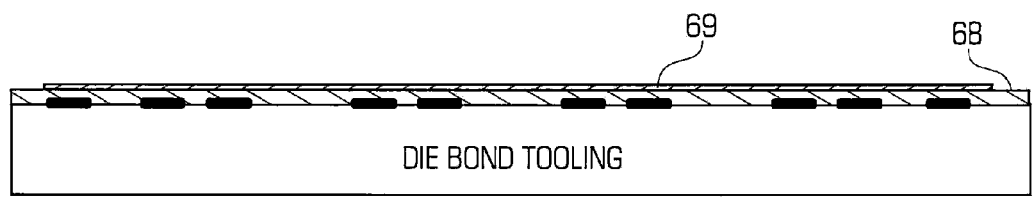
FIG. 4 is a cross-sectional view of the next step in the method of the present invention.
Figure 5:
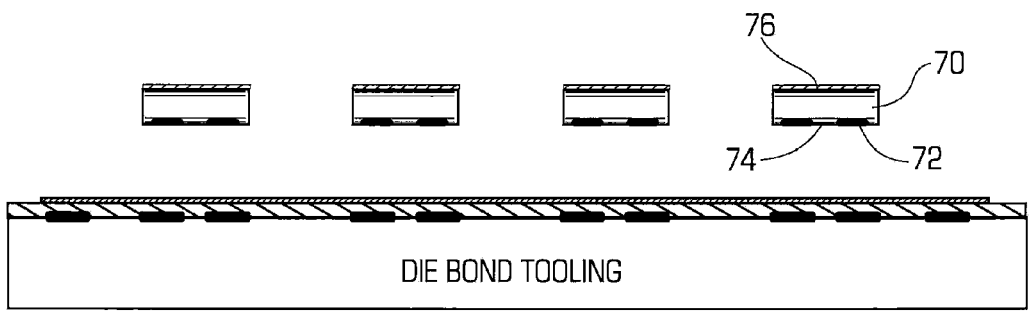
FIG. 5 is a cross sectional view of the next step in the method of the present invention.

A layer of PET 68 is applied to the top surface 62 of the first substrate 60. The material PET 68 can be a double sided adhesive film. Thus the PET layer 68 attaches to the first substrate 60. A printed glue layer 69, such as Q2-7406 from Dow Corning corporation is then applied to the PET layer 68. The glue layer 69 adheres to the PET layer 68. In addition, it will permit the die 70 (discussed in the next step) to adhere to the PET layer 68. The use of the PET layer 68 as well as the glue layer 69 is to ensure that a strong adhesive layer attaches the die 70 to attach to the PET layer 68 to prevent any void between the surface of the die 70 and the PET layer 68. At the same time, the use of the PET layer 68, with its low adhesive property is so that that the PET layer 68 can be readily removed from the first substrate 60, in subsequent processing. The resultant structure is shown in FIG. 4.

A plurality of integrated circuit dies 70 are then placed on the layer 69. Each of the integrated circuit dies 70 has bonding pads 72, and each die 70 is placed with its bonding pads 72 aligned with the marks 66. This is done by conventional well known die placement tools. Each of the dies 70 has a front surface 74 and a back surface 76. The bonding pads 72 are located on the front surface 74. After the dies 70 are placed on layer 69 which is on the layer 68 which is on the first substrate 60, a conductive silver paste 78 is applied to the back surface 76 of each of the dies 70. The resultant structure is shown in FIG. 6.

Figure 6:
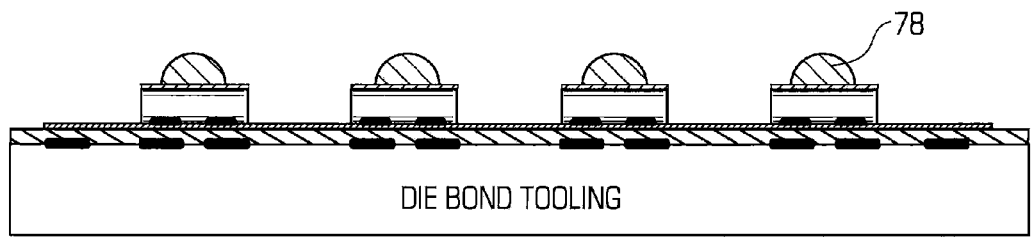
FIG. 6 is a cross sectional view of the next step in the method of the present invention.

A preformed lead frame 80 is then applied to the structure shown in FIG. 6. The preformed lead frame 80, which will be discussed in greater detail, has a central recessed portion 14 and a plurality of spaced apart leads 12. Each of the spaced apart leads 12 has bottom side 82 and a top side 84. Each of the recessed cavity 14 has a top portion and a bottom portion with the bottom portion of the recessed cavity 14 substantially co-planar with the bottom side 82 of the leads 12. The lead frame 80 is applied such that the dies 70 each with its conductive silver paste 78 are placed in the recessed cavities 14 of the lead frame 80, contacting the top portion of the recessed cavity 14. The lead frame 80 is then "pressed" downward, i.e. the lead frame 80 is pressed against the conductive silver paste 78 until the top side 84 of the leads 12 press against the layer 69. The resultant structure is shown in FIG. 7.

Figure 7:
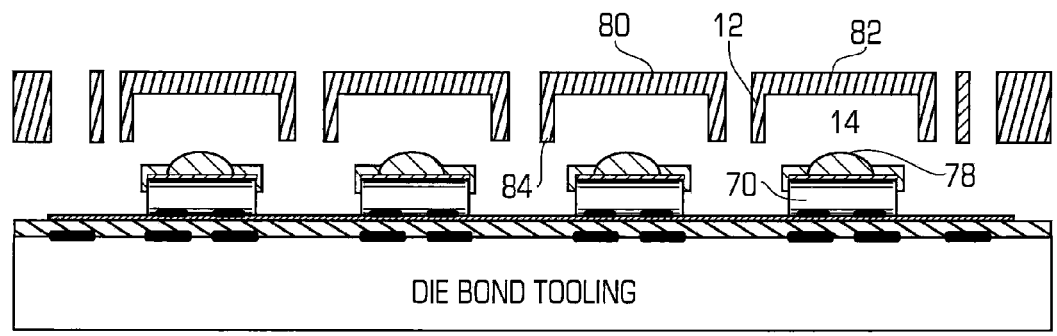
FIG. 7 is a cross sectional view of the next step in the method of the present invention.
Figure 8:
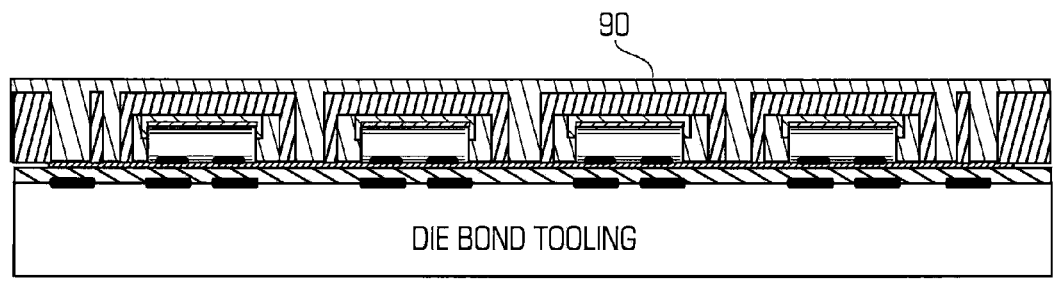
FIG. 8 is a cross-sectional view of the next step in the method of the present invention.

An insulator 90 is applied onto the structure shown in FIG. 7. Examples of insulators 90 that can be used, include X-35, TC-27 or EF-342× or other epoxies and compounds. All of these materials have the property that they generally have a high thermal conductivity property and flow relatively easily, such that they can be applied as in a liquid or paste form. The insulator 90 can be applied by any means including printing or spreading on the structure formed after FIG. 7. The insulator 90 is applied everywhere such that it even enters into the recessed portion 14, between the die 70 and the adjacent leads 12. The resultant structure is shown in FIG. 8.

Figure 9:
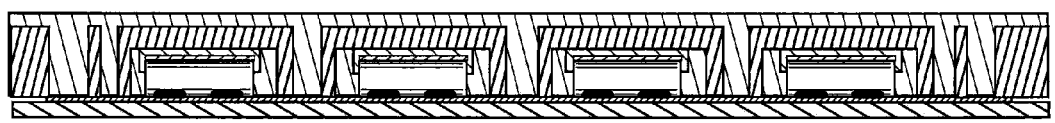
FIG. 9 is a cross-sectional view of the next step in the method of the present invention.

The first glass substrate 60 is then removed. Since the PET layer 68 is only lightly adhered to the first glass substrate 60, the first glass substrate 60 can simply be "peeled off". The resultant structure is shown in FIG. 9.

Figure 10:
FIG. 10 is a cross-sectional view of the next step in the method of the present invention.

The layers 68 and 69 are then removed by conventional means. Finally, the surface of the lead frame 80 which contains the bottom side 82 of the leads 12 is planarized to remove the excess insulator 90. The excess insulator 90 is removed by a planarization process, such as by any grinding process, including the use of sand paper (or any other abrasive material) against the surface of the lead frame 80 until the bottom side 82 of the leads 12 is exposed. The resultant structure is shown in FIG. 10.

Figure 11:
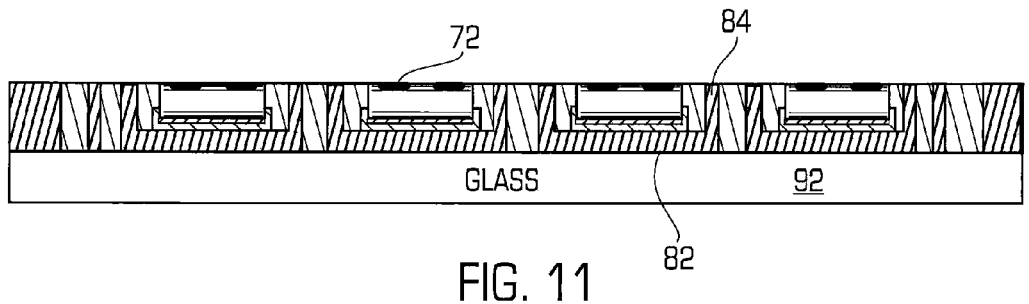
FIG. 11 is a cross-sectional view of the next step in the method of the present invention.

The structure is then mounted or placed on a second substrate 92, such as glass, with the surface of the lead frame 80 which contains the bottom side 82 of the leads 12 on the substrate 92. The structure can be placed on the second substrate 92 with a layer of adhesive, such as Q2-7406 from Dow Corning corporation. The second substrate 92 provides only rigid mechanical support for the subsequent processing. The resultant structure is shown in FIG. 11.

Figure 12:
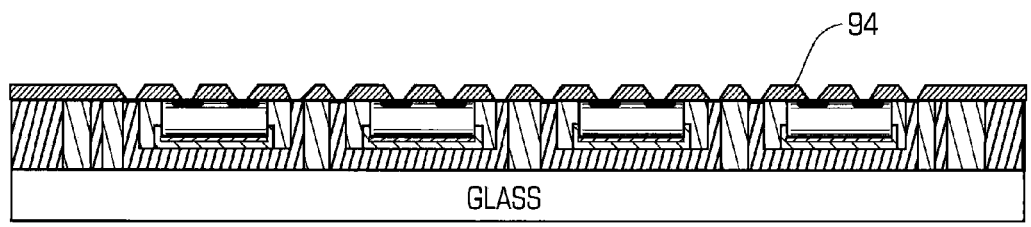
FIG. 12 is a cross-sectional view of the next step in the method of the present invention.

A layer 94 of SINR, a photosensitive dielectric material, such as SINR, PI, PBO, or others, is applied. The layer 94 is similar to a photoresist, and is applied on the surface that contains the top side 84 of the leads 12, as well as the bonding pads 72. The layer 94 is patterned to expose desired connections between certain of the bonding pads 72 to certain of the top sides 84 of certain of the leads 12. The resultant structure is shown in FIG. 12.

Figure 22:
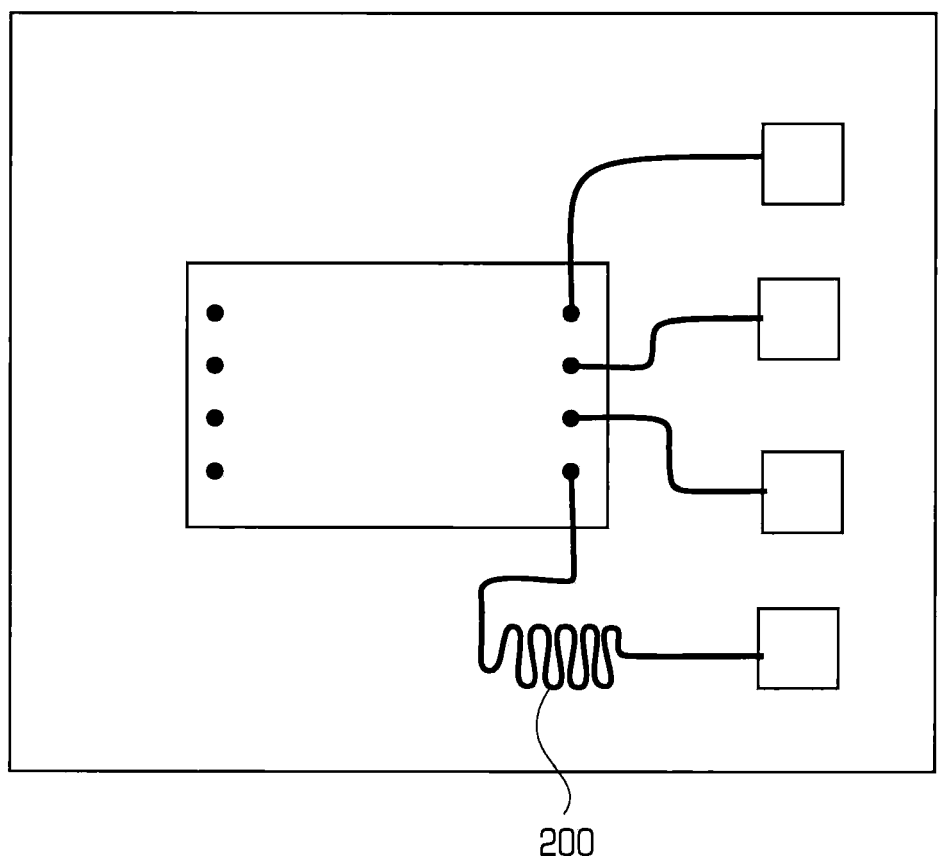
FIG. 22 is a top view of a die packaged with a preformed lead frame of the present invention using the method of the present invention, in which an inductor is incorporated into the package.

A conductive layer 96 is then deposited on the photoresist layer 94. Where the photoresist pattern is exposed, the conductive layer 94 forms an electrical connection between certain of the bonding pads 72 to certain of the top sides 84 of certain of the leads 12. In the process of forming the electrical connection between certain of the bonding pads 72 to certain of the top sides 84 of certain of the leads 12, the conductive layer 94 can be patterned to form an inductor 200. This is shown in FIG. 22. Thus, one of the significant benefits of the method and package of the present invention is that as a part of the packaging of the integrated circuit die 70, a passive circuit element such as an inductor 200 (or a resistor) can be formed and packaged along with the die 70 in the same package in which capacitors can be integrated. The resultant structure is shown in FIG. 13.

Figure 13:
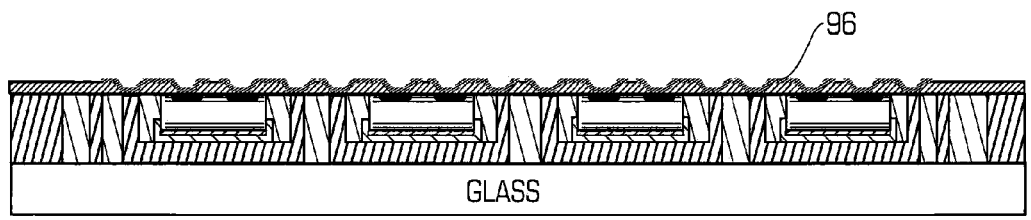
FIG. 13 is a cross-sectional view of the next step in the method of the present invention.
Figure 14:
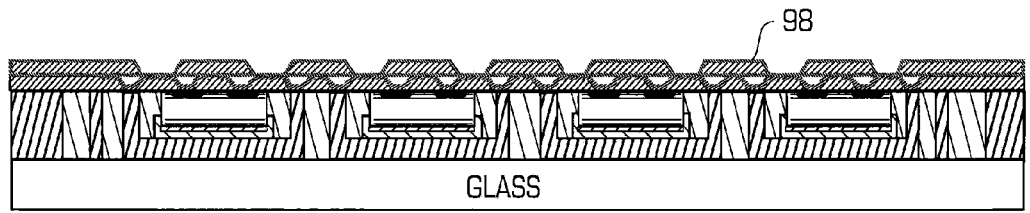
FIG. 14 is a cross-sectional view of the next step in the method of the present invention.

A second insulator 98 is then applied to the structure formed in FIG. 13, and in particular to cover the conductive layer 96. The resultant structure is shown in FIG. 14. The second insulator 98 can be another layer of SiNR which is a photosensitive dielectric material. After the layer 98 is deposited, openings can be formed in the layer 98 to expose portions of the conductive layer 94.

Figure 15:
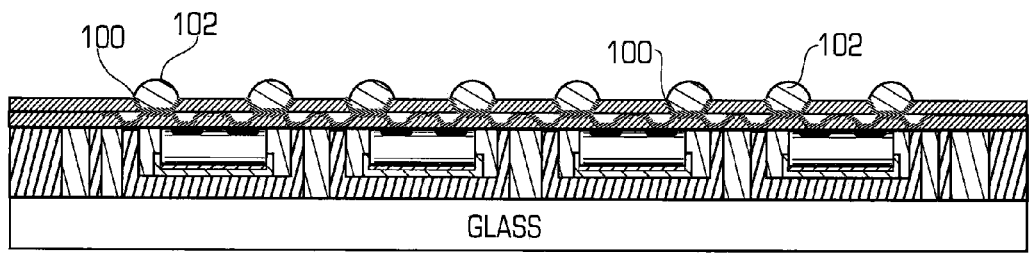
FIG. 15 is a cross-sectional view of the next step in the method of the present invention.

In those openings of the second insulator 98, UBM (Under Bump Metallization) 100 is then deposited. The UBM 100 forms a reaction barrier layer for the solder balls 102 that are formed in the subsequent step to connect electrically to the exposed portion of the conductive layer 94. Solder balls 102 are then placed into the same openings of the second insulator 98 on the layer of UBM 100. The balls 102 can be positioned by a conventional placement tool or printing method. The resultant structure is shown in FIG. 15.

Thereafter, the second glass substrate 92 is removed. In addition, the PET adhesive layer is also removed. The bottom side 82 is then cleaned. The resultant structure is shown in FIG. 16.

Figure 16:
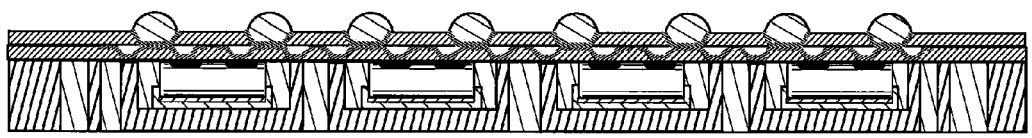
FIG. 16 is a cross-sectional view of the next step in the method of the present invention.
Figure 17:
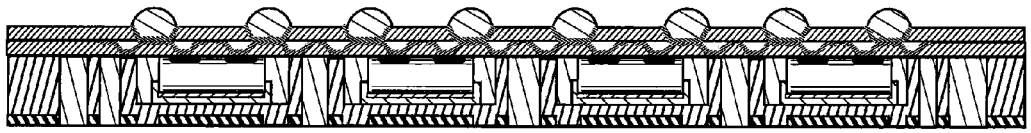
FIG. 17 is a cross-sectional view of the next step in the method of the present invention.

The structure of FIG. 16 is then immersed in a tin plating solution. The tin will adhere only to the exposed copper lead frame and will not adhere to the insulator 90. In particular, tin will adhere to the bottom side 82 of each lead 12, and to the bottom portion of the recessed cavity 14. The resultant structure is shown in FIG. 17.

Figure 18:
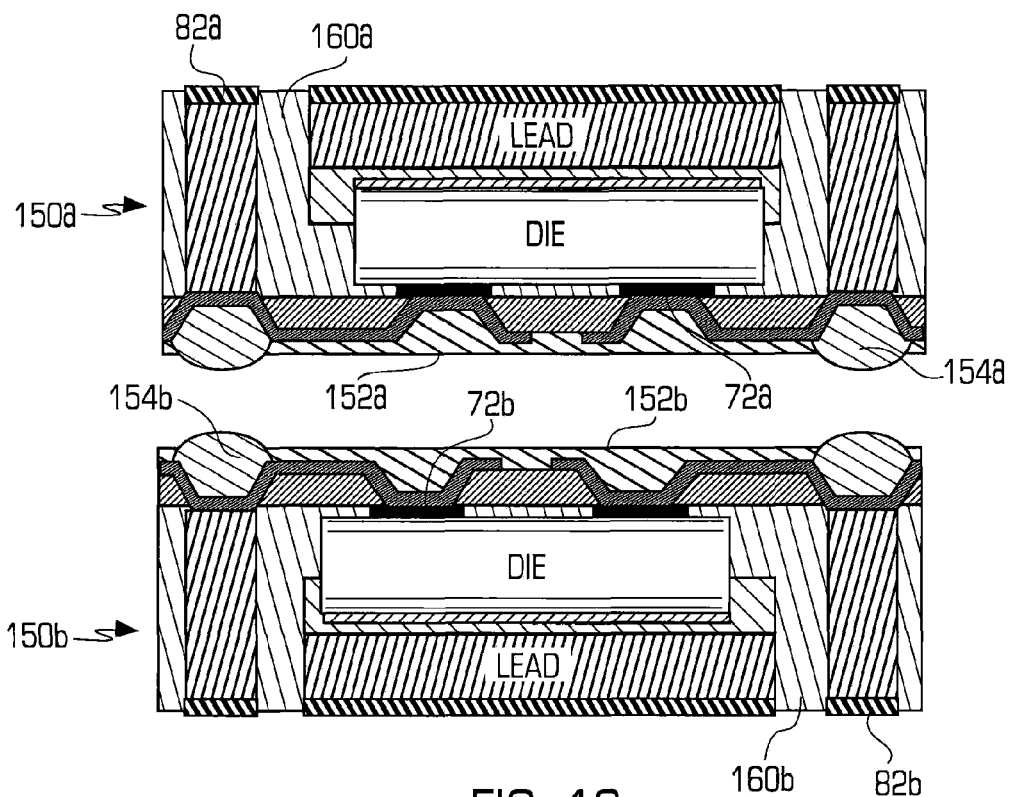
FIG. 18 is a cross-sectional view of one method of stacking the packaged dies of the present invention.

There are many advantages of the method and structure of packaged integrated circuit die of the present invention. First, with the method and device of the present invention, a packaged integrated circuit die with integrated passive elements such as resistors and inductors and capacitors can be directly packaged with the die. Further with the method and device of the present invention, a P-O-P (Package-On-Package) device can be achieved. Referring to FIG. 18, there is shown a first embodiment of a P-O-P embodiment using the device of the present invention. A first packaged integrated circuit die 150a has a first surface 152a which has solderable balls 154a with the solderable balls 154a electrically connected to the bonding pads 72a. The second surface 160a, opposite to the first surface 152a has conductive contacts to the bottom side 82a of the leads 12a. A second packaged integrated circuit die 150b has a first surface 152b which has solderable balls 154b with the solderable balls 154b electrically connected to the bonding pads 72b. The second surface 160b, opposite to the first surface 152b has conductive contacts to the bottom side 82b of the leads 12b. The first and second packages 150a and 150b are positioned such that the surfaces 152a and 152b face one another with the solderable balls 154a and 154b in contact with one another. In this manner the two packages 150a and 150b can be soldered to one another and still provide electrical contacts through the bottom of the leads 82a and 82b.

Figure 19:
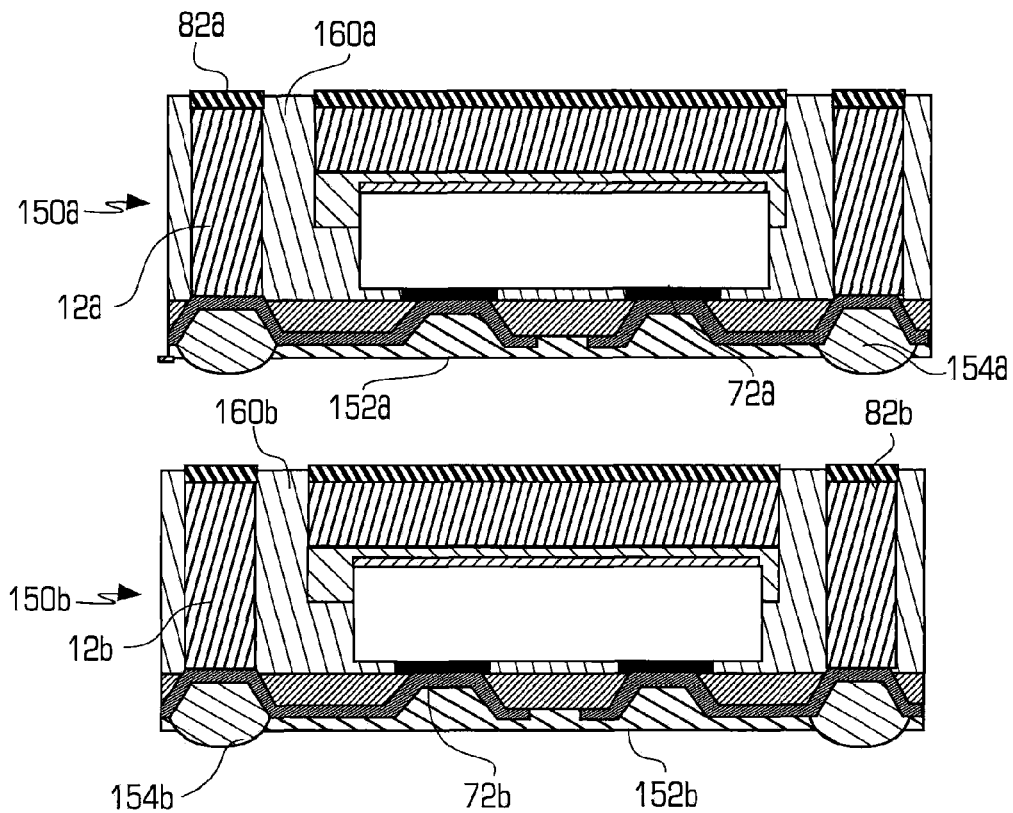
FIG. 19 is a cross-sectional view of another method of stacking the packaged dies of the present invention.
Figure 20:
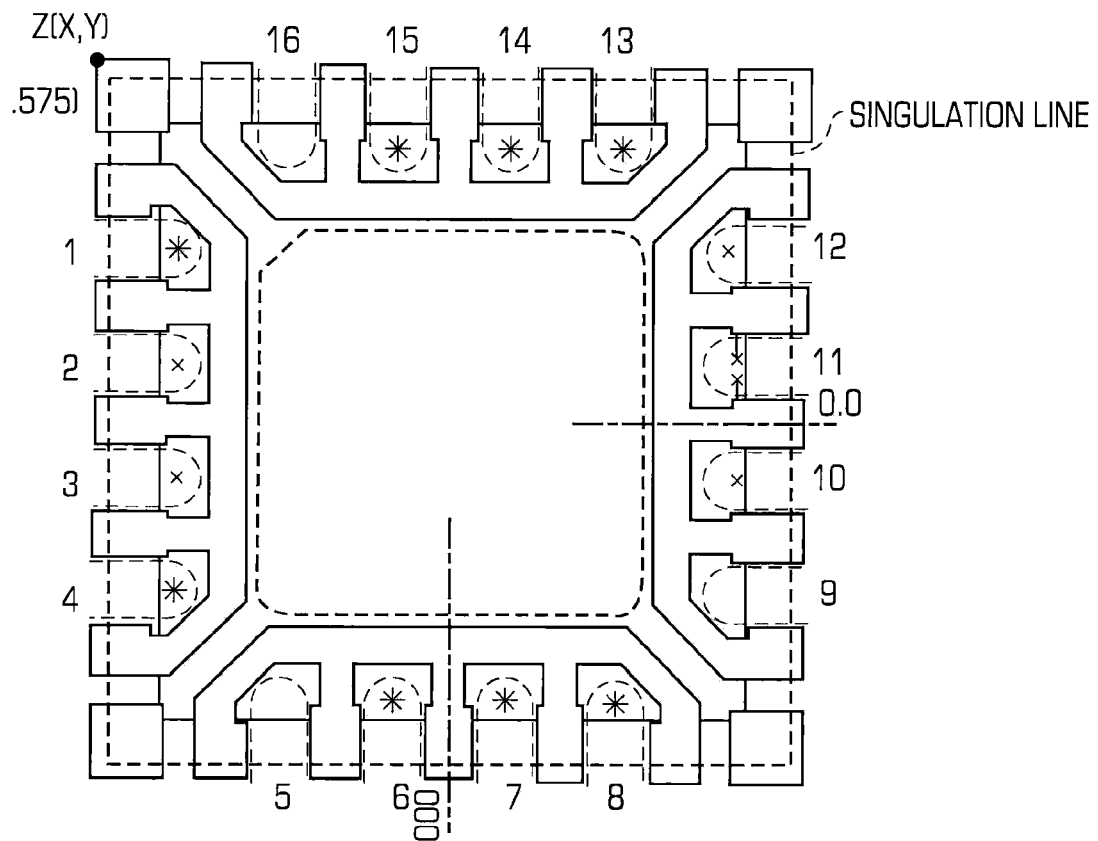
FIG. 20 is a top view of a preformed lead frame of the prior art.

Referring to FIG. 19, there is shown a second embodiment of a P-O-P embodiment using the device of the present invention. A first packaged integrated circuit die 150a has a first surface 152a which has solderable balls 154a with the solderable balls 154a electrically connected to the bonding pads 72a. The second surface 160a, opposite to the first surface 152a has conductive contacts to the bottom side 82a of the leads 12a. A second packaged integrated circuit die 150b has a first surface 152b which has solderable balls 154b with the solderable balls 154b electrically connected to the bonding pads 72b. The second surface 160b, opposite to the first surface 152b has conductive contacts to the bottom side 82b of the leads 12b. The first and second packages 150a and 150b are positioned such that the surfaces 152a and 160b face one another with the solderable balls 154a in contact with the bottom sides 82b of the package 150b. In this manner the two packages 150a and 150b can be soldered to one another and still provide electrical contacts through the bottom of the leads 82a and through the solderable balls 154b.

Figure 21:
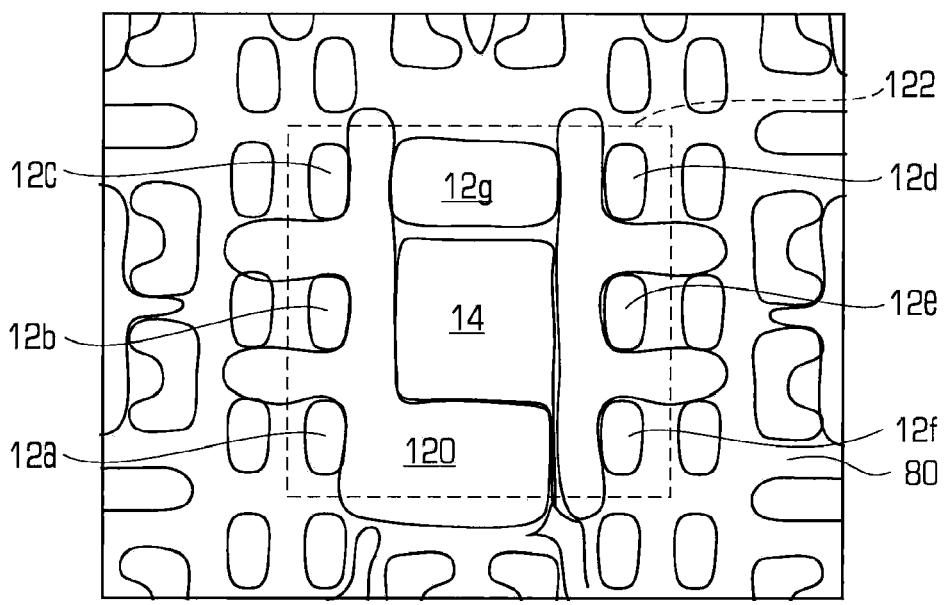
FIG. 21 is a top view of a preformed lead frame of the present invention for use in the method of the present invention.

Referring to FIG. 21, there is shown a top view of a lead frame 80 of the present invention for use in the method and device of the present invention. The lead frame 80 when used in the method of the present invention comprises a recessed portion 14. The recessed portion 14 is connected to the rest of the lead frame 80 by a connection member 120. The lead frame 80 also comprises a plurality of leads 12 (a-f) and another lead 12g, which is electrically connected to the recessed portion 14. Although only 6 leads 12 are shown, it will be appreciated that the present invention may use a lead frame 80 with any number of leads 12. When the lead frame 80 is singulated, i.e. cut along the line 122, all of the leads 12(a-f) are electrically isolated from one another, except the lead 12(g) is electrically connected to the recessed portion 14. In this manner, the electrical connection to the recessed portion 14 can be made by electrically connecting to either the recessed portion 14 or to the top side of the lead 12(g). In this manner, connections to the bottom of the die 20 can be made from either side of the packaged die.

From the foregoing it can be seen that the method of the present invention provides for a compact means to package integrated circuit dies, and a compact integrated circuit die is made thereby.

What is claimed is:

1. A method of packaging an integrated circuit die comprising:
   a) placing a plurality of integrated circuit dies on a first substrate having a planar surface, each of said plurality of dies has a top surface and a bottom surface with the top surface having a plurality of bonding pads for electrical connection to said die; said plurality of dies positioned with said top surface in contact with said planar surface of said first substrate;
   b) applying a conductive adhesive to the bottom surface of each of said dies;
   c) placing a plurality of connected lead frames on said plurality of dies; each lead frame having a central recessed portion, and a plurality of conductive leads with each lead having a top side and a bottom side, said central recessed portion connected to said plurality of leads by a connection, with said central recessed portion having a top portion and a bottom portion with the bottom portion substantially co-planar with the bottom side of the plurality of leads, said central recessed portion of said lead frame placed on said conductive adhesive of said plurality of dies with said top portion of said recessed portion in contact with said conductive adhesive until the top side of each lead is in contact with said planar surface of said first substrate;

d) removing said first substrate;

e) placing the plurality of lead frames with said plurality of dies on a second substrate having a planar surface, with said bottom side of each lead and the bottom portion of the recessed portion on said planar surface of said second substrate;

f) depositing a conductive layer on said top surface of said die and said top side of said leads;

g) patterning the conductive layer to electrically connect certain of said bonding pads of one of said plurality of dies to certain of conductive leads associated with said one die; and h) cutting each of said connection of each lead frame from adjacent lead frames and the leads from said recessed portion.

2. The method of claim 1 further comprising the step of filling the structure formed after step c) with an insulator to fill the space between each die and its adjacent leads of the associated lead frame.

3. The method of claim 2 further comprising the step of planarizing the structure formed after step (d) to remove any insulator on the bottom side of each lead and the bottom portion of the recessed portion.

4. The method of claim 2 wherein said depositing step deposits a conductive layer on said top surface of said die and said top side of said leads and over said insulator between each die and the adjacent leads of the associated lead frame.

5. The method of claim 4 wherein said conductive layer is patterned to form passive circuit elements connecting certain of said bonding pads of one of said plurality of dies to certain of conductive leads associated with said one die.

6. The method of claim 4 further comprising
attaching a conductive bump of a solder material to the bottom side of each lead.

7. The method of claim 6 further comprising
attaching a conductive bump of a solder material to the top side of each lead.

\* \* \* \* \*